US007208343B2

(12) United States Patent
Song et al.

(10) Patent No.: US 7,208,343 B2
(45) Date of Patent: Apr. 24, 2007

(54) SEMICONDUCTOR CHIP, CHIP STACK PACKAGE AND MANUFACTURING METHOD

(75) Inventors: Young Hee Song, Yongin (KR); Sa Yoon Kang, Seoul (KR); Min Young Son, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 11/017,805

(22) Filed: Dec. 22, 2004

(65) Prior Publication Data

US 2005/0101056 A1 May 12, 2005

Related U.S. Application Data

(62) Division of application No. 10/357,376, filed on Feb. 4, 2003, now Pat. No. 6,849,802.

(30) Foreign Application Priority Data

Feb. 6, 2002 (KR) ................................. 2002-6765

(51) Int. Cl.
*H01L 21/00* (2006.01)
(52) U.S. Cl. ..................... 438/106; 438/107; 438/109; 438/113; 257/E25.013
(58) Field of Classification Search ............... 438/106, 438/107, 109, 113; 257/E25.013
See application file for complete search history.

(56) References Cited

U.S. PATENT DOCUMENTS 5,394,303 A 2/1995 Yamaji ....................... 361/749

6,188,127 B1 * 2/2001 Senba et al. ................. 257/686
6,322,903 B1 * 11/2001 Siniaguine et al. .......... 428/617
6,531,784 B1 * 3/2003 Shim et al. .................. 257/777
2002/0139577 A1 * 10/2002 Miller ......................... 174/261
2002/0164838 A1 * 11/2002 Moon et al. ................. 438/107

* cited by examiner

*Primary Examiner*—Trung Dang
(74) *Attorney, Agent, or Firm*—Harness, Dickey & Pierce (57) ABSTRACT

A semiconductor chip with conductive wiring that is routed to the edge of the substrate from the chip's backside. A plurality of such semiconductor chips are stacked and electrically connected using a wiring element that is a circuit board or conductive adhesive strips. The wiring element connects the conductive wiring of each semiconductor chip along the sides of the chips to the package substrate. A method of manufacturing the semiconductor chip includes batch manufacturing a plurality of die on a wafer with an active surface on which a plurality bonding pads are formed, and a backside which is the rear side of the active surface; forming a circuit groove on the backside; applying conductive wiring on the circuit groove using a conductive material; and separating the wafer into a plurality of semiconductor chips. A method of manufacturing the chip stack package with a plurality of such semiconductor chips having bump pads and connection pads routed to the side surface of the semiconductor chip includes stacking and bonding the bonding pad of the upper semiconductor chip on the bump pad of a lower semiconductor chip; electrically connecting the bonding pad of the lowest semiconductor chip to the substrate by bump bonding electrically connecting the wiring element to the connection pad of the semiconductor chip and the substrate; and connecting an external connection to the substrate.

11 Claims, 11 Drawing Sheets

SEMICONDUCTOR CHIP, CHIP STACK PACKAGE AND MANUFACTURING METHOD

CROSS-REFERENCE TO RELATED APPLICATION

This is a divisional application of U.S. patent application Ser. No. 10/357,376, filed Feb. 4, 2003 now U.S. Pat. No. 6,849,802, which claims priority on Korean Patent Application No. 2002-6765, filed on Feb. 6, 2002, the entire contents of which are incorporated herein by reference.

BACKGROUND

1. Field of the Invention

The present invention relates to a chip stack package and more particularly to a semiconductor chip, a chip stack package, and method for manufacturing.

2. Description of Related Art

In an atmosphere of incessant pressure to reduce the size of electronic products while maintaining and increasing their functionality, extreme attention is given to every single element of an electronic assembly. Because of growing pressure to reduce size, a whole new class of IC package, especially flip chip technique and chip-scale package techniques were introduced. However, as good as these devices are at reducing the size of electronics assemblies, they too have been unable to placate the appetite of the consumer for increasing functionality of electronic products.

As a result, product engineers and designers have turned their attention to the third dimension in IC packaging. Stack techniques have emerged as an innovative means to meet the market requirements of next generation electronic products. There are variations to the stack technique such as stacking semiconductor chips or stacking packages.

The later stack package has functional diversity, since various packages are assembled, and improved reliability since the assembled elements passed functional and reliability tests. Further, this stacked package has an advantage of increased memory capacity. Since two or more packages are stacked, the size of the package increases and therefore it is very difficult to handle.

On the other hand, to solve the foregoing problem the former chip stack package has at least two semiconductor chips in a package. This stacked package has an advantage of memory capacity and functionality that can be efficiently increased. Further, the thickness of the stack device can be further reduced when compared with the above package stack device. However the larger and larger chip stacks contain multiple chips which incur cooling problems. Because the chip stack contains multiple chips, they generate more heat per unit volume, requiring greater thermal dissipation. Moreover, this dissipation must occur now through layers of semiconductor substrate material.

Figure 1:
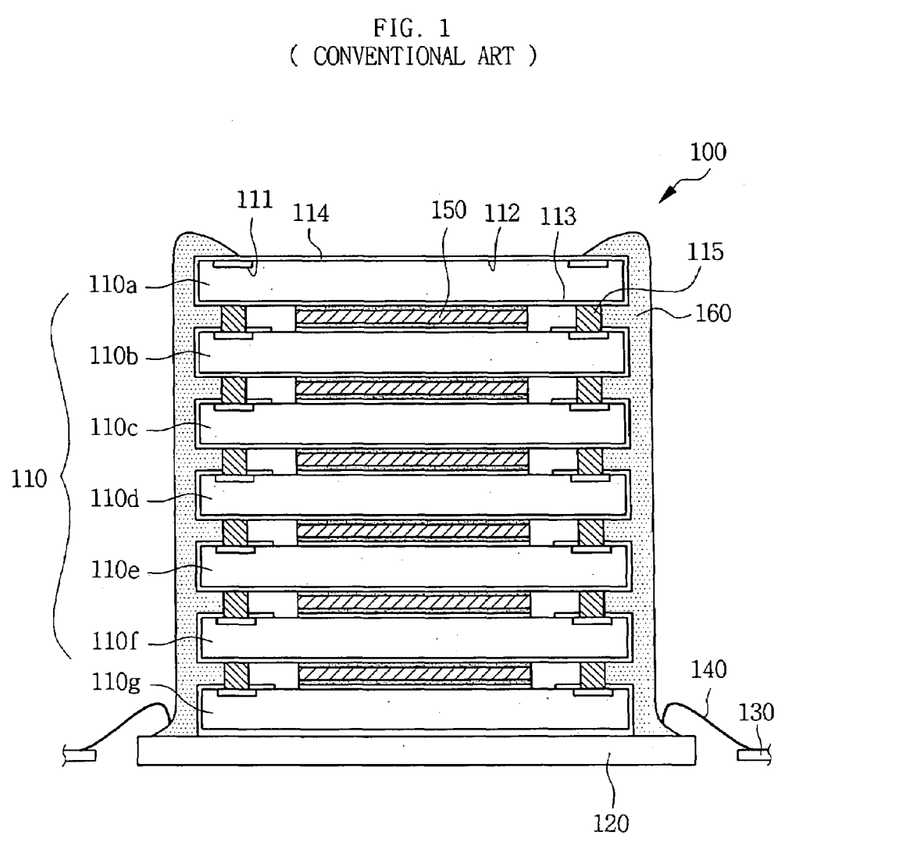
FIG. 1 is a sectional view showing a conventional chip stack package.

FIG. 1 is a sectional view showing a conventional chip stack package available from Vertical Circuit Inc., U.S.A. As shown in FIG. 1, the chip stack package 100 has a plurality of semiconductor chips 110. The semiconductor chips 110 have an active surface 112 formed with bonding pads 111 and a backside 113 that is at the rear of the active surface 112. An insulation layer 114 covers the entire surface of the semiconductor chips 110 only exposing bonding pads 111 for conductive bumps 115. The conductive bumps 115 are attached between the bonding pads 111 of lower chips 110b, 110c, 110d, 110e, 110f and 110g and the backside 113 of respective upper semiconductor chips 110a, 110b, 110c, 110c, 110d, 110e and 110f.

A heat sink 150 is placed between each two neighboring semiconductor chips 110 for ensuring efficient heat emission from each semiconductor chip 110. The lowest semiconductor chip 110g is attached on a silicon substrate 120. The stacked chips 110 and substrate 120 are electrically interconnected by the conductive bumps 115 and a conductive adhesive 160. Lastly, for electrical connection of the chips 110 externally, the silicon substrate 120 is bonded to lead frame 130 using conventional die-attach and wire-bonding processes. Then the structure 100 is molded, formed and trimmed.

The signal path in the chip stack package 100 is from an external device to the lead frame 130, the bonding wires 140, the silicon substrate 120, the conductive adhesive 160, each conductive bump 115, and to each semiconductor chip 110a to 110g. During operation of the chips 110, heat is generated, which is emitted to the outside through the heat sink 150.

In this chip stack package 100, the interconnection of each semiconductor chip 110 and silicon substrate 120 is made by the conductive adhesive 160 instead of wires conventionally used in packaging technology. Many problems occurring due to using the wires, for example, wire sweeping at higher wire loop in molding process, increased signal path length and increased inductance are resolved by using the conductive adhesive 160. The chip stack package 100 can gain higher speed and lower noise levels by reducing the signal inductance and power/ground inductance.

However, when the chip stack package 100 includes different types of semiconductor chips 110, the conductive adhesive 160 is not easily formed due to different dimensions of the chips 110 in profile. This causes difficulty in realizing a multi-functional stack package by using different chips. Additionally, it is hard to efficiently inject the conductive adhesive 160 into a space between neighboring semiconductor chips 110, which results in poor electrical connection with the conductive bumps 115. Therefore, the conventional chip stack package 100 cannot employ a center pad type chip in which the bonding pads are centrally disposed on the active surface, but an edge pad type chip in which the bonding pads are peripherally disposed on the active surface.

SUMMARY OF THE INVENTION

Exemplary embodiments of the present invention provide a semiconductor chip which includes an active surface, a back surface obverse to the active surface, and a side surface between the active surface and the back surface. The semiconductor chip further includes a plurality of bonding pads formed on the active surface, and a plurality of bump pads formed on the back surface. Each of the bum pads corresponds to each bonding pad the semiconductor chip still further includes a plurality of connection lines formed on the back surface. Each connection line is connected to the bump pad and extended to the side surface the semiconductor chip may further include at least one heat dissipation part formed on the back surface.

Other exemplary embodiments of the present invention provide a chip stack package which includes a circuit board, a lower semiconductor chip, at least one upper semiconductor chip, a plurality of bumps, an interconnecting member, and a plurality of outer terminals. The circuit board has first contact pads and second contact pads. Each of the semiconductor chip has an active surface, a back surface obverse to the active surface, a side surface between the active surface and the back surface, bonding pads formed on the active surface, bump pads formed on the back surface and corresponding to the bonding pad, and connection lines formed on the back surface, connected to the bump pads and extended to the side surface. The bumps electrically and physically connect the bonding pads of the upper semiconductor chip to the bum pads of the lower semiconductor chip, and connect the bonding pads of the lower semiconductor chip to the second contact pads of the circuit board. The interconnecting member is applied to the side surfaces of both the lower and upper semiconductor chips and connected to the first contact pads of the circuit board. The outer terminals are electrically connected to the circuit board.

In the chip stack package, each semiconductor chip may further have at least one heat dissipation part formed on the back surface. Additionally, each semiconductor chip may have grooves etched on the back surface and filled with the bump pads, the connection lines, and the heat dissipation part. Optionally, each semiconductor chip has an insulation layer formed on the entire back surface or on surfaces of the grooves. The bonding pads of each semiconductor chip may be disposed along a central line of the back surface. The interconnecting member may be a conductive adhesive coated on the side surface along each vertical row of ends of the connection lines and terminated to the first contact pads, or a wiring board having conductive lines on an insulating board, the respective conductive lines being attached to ends of the connection lines at the side surface and connected to the first contact pads. The outer terminals may be metallic balls attached to the circuit board, or lead frames electrically connected to the circuit board by bonding wires.

Other exemplary embodiments of the present invention provide methods of manufacturing a semiconductor chip and a chip stack package. To manufacture the semiconductor chip, a semiconductor wafer having semiconductor chips and scribe lines is provided. Each semiconductor chip has bonding pads formed on an active surface, and each scribe line is formed between the adjacent semiconductor chips. And, grooves are formed on a back surface obverse to the active surface, and, by applying a conductive material in the grooves, bump pads and connection lines are formed. Each bump pad corresponds to each bonding pad, and each connection line is extended from the bump pad and exposed to the scribe line. Then, wafer is separated along the scribe lines into the semiconductor chips.

To manufacturing the chip stack package, a lower semiconductor chip and at least one upper semiconductor chip are provided. Each semiconductor chip has bonding pad formed on an active surface, bump pads formed on a back surface obverse to the active surface and respectively corresponding to the bonding pads, and connection lines formed on the back surface and respectively extended from the bump pads to a side surface between the active surface and the back surface. Also, a circuit board having first contact pads and second contact pads is provided. By using bumps, the bonding pads of the upper semiconductor chip are bonded to the bump pads of the lower semiconductor chip, and the bonding pads of the lower semiconductor chip are bonded to the second contact pads of the circuit board. An interconnecting member is applied to the side surfaces of both the lower and upper semiconductor chips such that the interconnecting member is electrically connected to the connection lines at the side surfaces and the first contact pads of the circuit board. Outer terminals are formed such that the outer terminals are electrically connected to the circuit board.

BRIEF DESCRIPTION OF THE DRAWINGS

These and other purposes, features and advantages of the present invention will be readily understood with reference to the following detailed description thereof provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 2A:
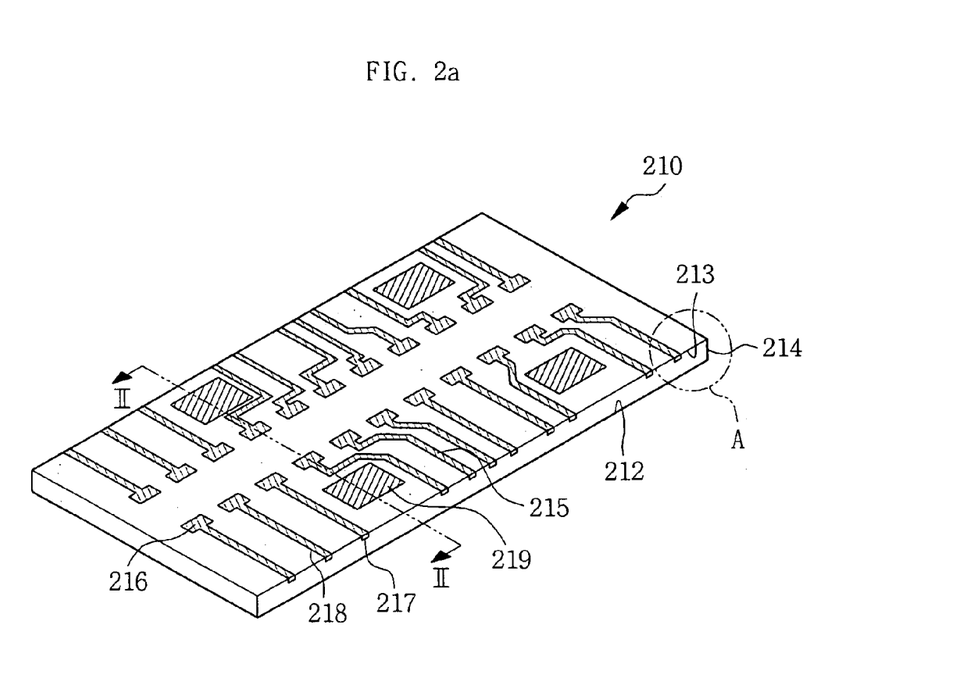
FIG. 2a is a perspective view showing a semiconductor chip according to one embodiment of the present invention.
Figure 2B:
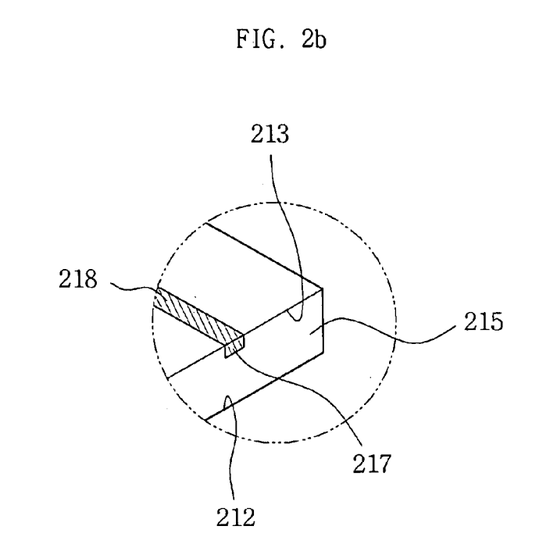
FIG. 2b is an enlarged view of portion A as indicated on FIG. 2.

FIG. 2a is a perspective view showing a semiconductor chip 210 according to one embodiment of the present invention and FIG. 2b is a cross-sectional view taken along the line IIB—IIB of FIG. 2a. As shown in FIGS. 2a and 2b, the semiconductor chip 210 has an active surface 212 where on-chip circuits (not shown) and bonding pads 211 are formed, and a backside 213 which is the obverse to the active surface 212. The bonding pads 211 are disposed along a longer central line of the active surface 212. Therefore, the semiconductor chip 210 is a center pad type chip. The back surface 213 has bump pads 216 and connection lines 218. Each connection line 218 is connected to each bump pad 216 and extended to a side surface 215 of the semiconductor chip 210. Like the bonding pads 211, the bump pads 216 are disposed along a longer central line of the back surface 213. The bump pads 216 and the connection lines 218 are formed in grooves 217 etched on the back surface 213.

The semiconductor chip 210 further has at least one heat dissipation part 219 that is formed between the connection lines 217. The heat dissipation part 219 is formed in the groove 217 by plating high conductivity material such as metals like Cu, Ag, Au, Pt, and Al etc. Preferably, the heat dissipation part 219, the bump pads 216 and the connection lines 218 are formed at the same time. The heat produced by the semiconductor chip 210 is easily spread to the chip's outer side by the heat dissipation part 219, together with the bump pads 216 and the connection lines 218.

Figure 3A:
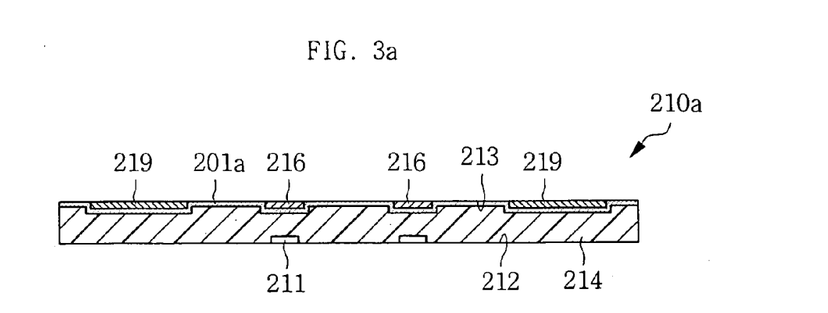
FIG. 3a is a cross-sectional view showing a semiconductor chip according to another embodiment of the present invention.
Figure 3B:
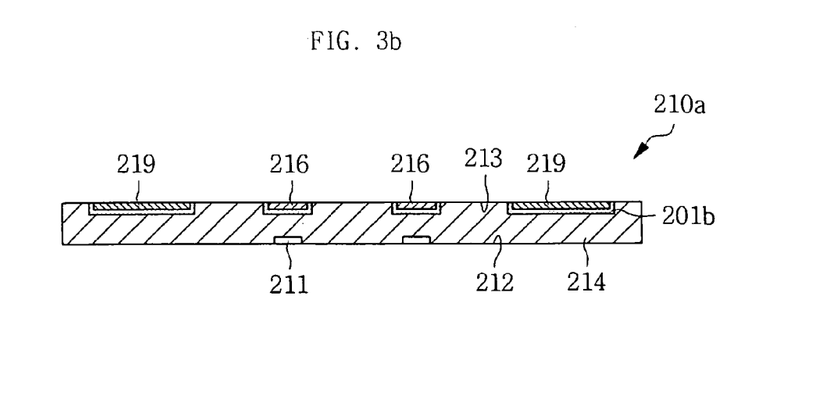
FIG. 3b is a cross-sectional view showing a semiconductor chip according to still another embodiment of the present invention.

FIG. 3a is a cross-sectional view showing a semiconductor chip 210a according to another embodiment of the present invention and FIG. 3b is a cross-sectional view showing a semiconductor chip 210b according to still another embodiment of the present invention. These Figures show embodiments having different insulation layers. The insulation layer is formed on the entire back surface 213, as shown with a layer 201a in FIG. 3a, or on surfaces of the grooves 217, as shown with a layer 201b in FIG. 3b. The insulation layer 201a or 201b is intended to reduce the signal interference and leakage between circuits on the active surface 212 an the back surface 213. Therefore, the insulation layer 201a or 201b is formed before the high conductivity material 218 is formed in the groove 217.

Figure 4:
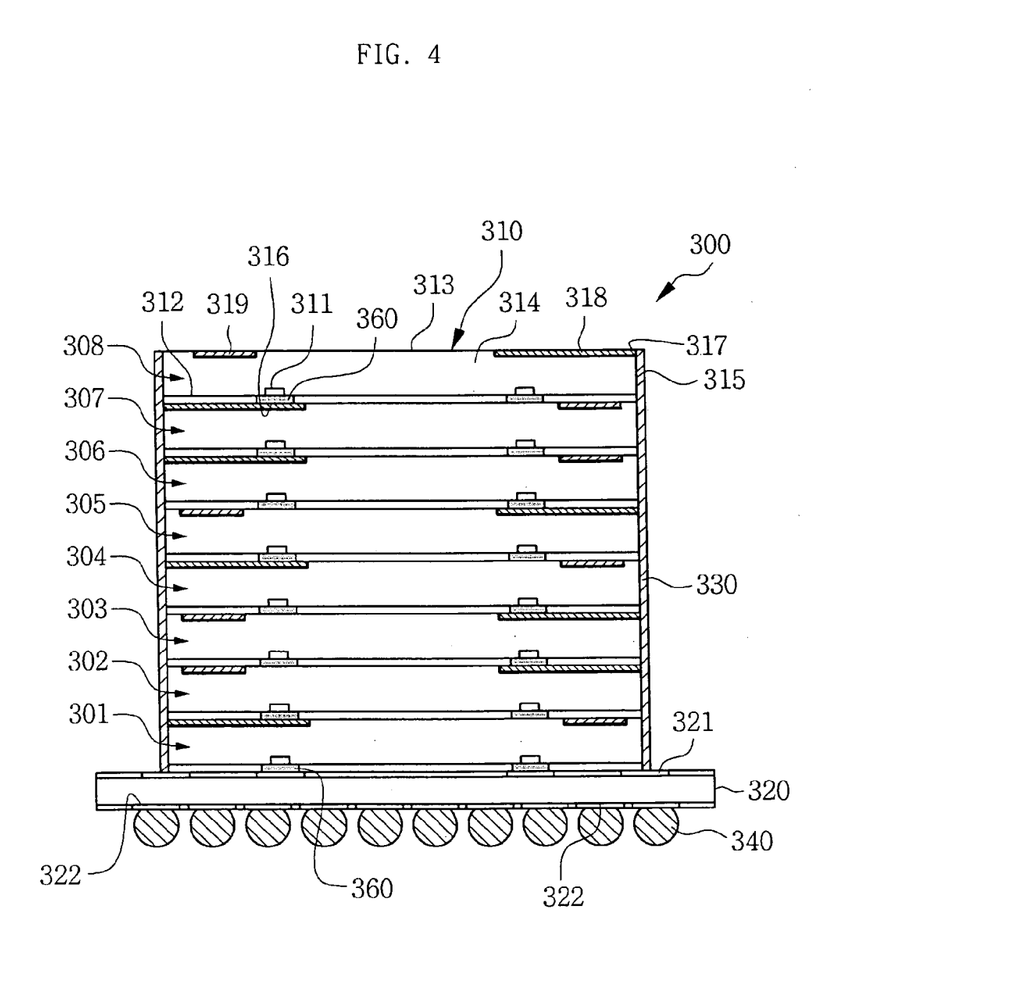
FIG. 4 is a cross-sectional view showing a chip stack package according to one embodiment of the present invention.
Figure 5:
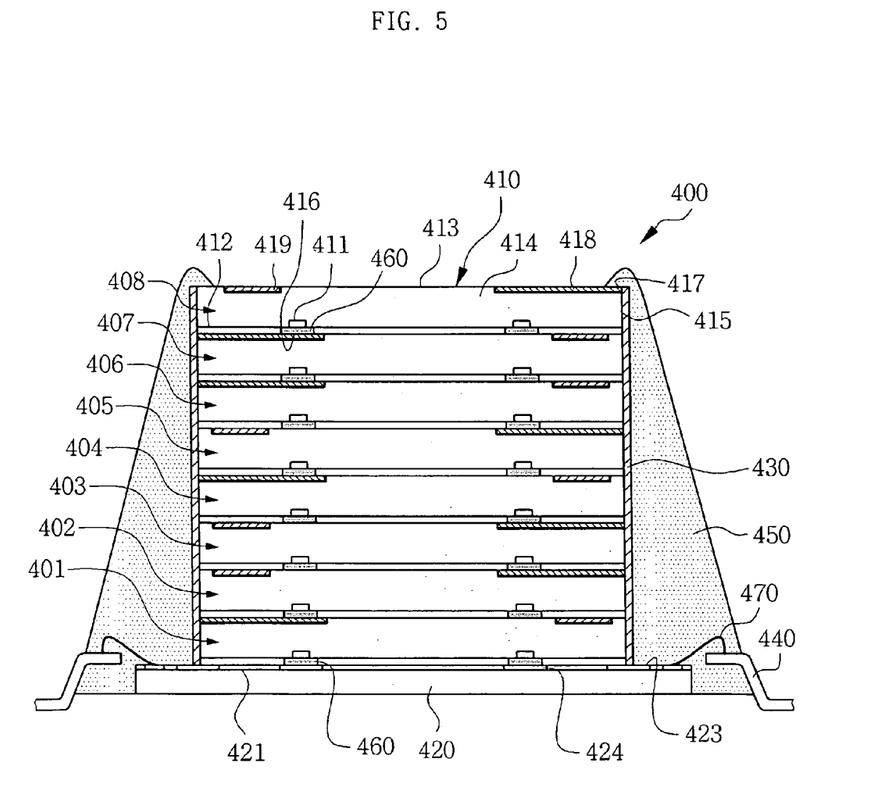
FIG. 5 is a cross-sectional view showing a chip stack package according to another embodiment of the present invention.

FIG. 4 is a cross-sectional view showing a chip stack package 300 according to one embodiment of the present invention. FIG. 5 is a cross-sectional view showing a chip stack package 400 according to another embodiment of the present invention. As shown in FIGS. 4 and 5, a chip stack package 300 or 400 has a plurality of semiconductor chips, 301–308 and 401–408 respectively, each of which is one of three types of the semiconductor chip described above with reference to FIGS. 2b, 3a and 3b. All semiconductor chips 301–308 are stacked on a circuit board 320 as shown in FIG. 4 or all semiconductor chips 401–408 are stacked on a circuit board 420 as shown in FIG. 5 so that each active surface 312, 412 thereof faces toward the circuit board 320, 420. In particular, the bonding pad 311, 411 of an upper semiconductor chip (for example, 305 or 405) is electrically and physically connected to the corresponding bump pad 316, 416 of the adjacent lower semiconductor chip (for example, 304 or 404) by a bump 360, 460. On the other hand, the bonding pad 311, 411 of the lowermost semiconductor chip 301, 401 is connected to second contact pads 324, 424 on the top plane 321, 421 of the circuit board 320, 420 by the bump 360, 460.

Still referring to FIGS. 4 and 5, the chip stack package 300 or 400 further has an interconnecting member 330, 430, which is adhered to the side surfaces of the chips 301–308 pr 401–408 and a top plane 321, 421 of the circuit board 320, 420. Therefore, the end of the connection line 318, 418 (not shown in FIGS. 4 and 5, but shown in FIG. 2a or FIGS. 6 and 7) is electrically and physically connected to the interconnecting member 330, 430 at the side surface 315, 415 of each chips 301–308 or 401–408. As a result, the bonding pads 311, 411 of each chip (for example, 305, 405), except the lowermost chip 301, 401, are electrically connected in sequence to the bumps 360, 460 the bump pads 316, 416 of the lower chip (for example, 304, 404), the connection lines 318, 418 of the lower chip, the interconnecting member 330, 430 and the circuit board 320, 420 320b. More detailed descriptions about the interconnecting member 330, 430 will be given below.

The chip stack package 300, 400 in FIGS. 4 and 5 also has outer terminals 340, 440. One of the differences between two embodiments in FIGS. 4 and 5 is the outer terminals. While the chip stack package 300 of FIG. 4 uses metallic balls 340 as the outer terminals, the chip stack package 400 of FIG. 5 uses lead frames 440. Additionally, while the metallic balls 340 of FIG. 4 are directly attached to a bottom plane 322 of the circuit board 320a, the lead frames 440b of FIG. 5 are electrically connected to the top plane 421 of the circuit board 420 through bonding wires 470. Therefore, the circuit board 320 of FIG. 4 has circuitry pattern, such as contact pads of FIGS. 6 and 7, on both top and bottom plane, whereas the circuit board 420 of FIG. 5 has circuitry pattern on only top plane. Further, as illustrated in FIG. 5, the chip stack package 400 may have an encapsulation part 450, such as a resin-molded part, for protecting wire-bonded portions from hostile external environment.

Figure 6:
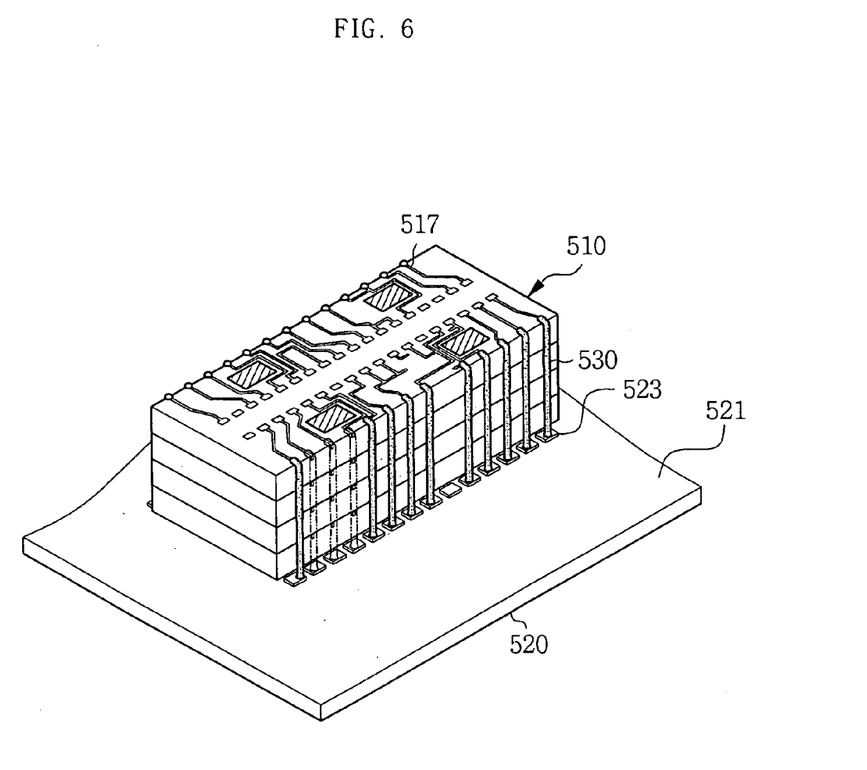
FIG. 6 is a partial perspective view showing a semi-processed chip stack package according to one embodiment of the present invention.
Figure 7:
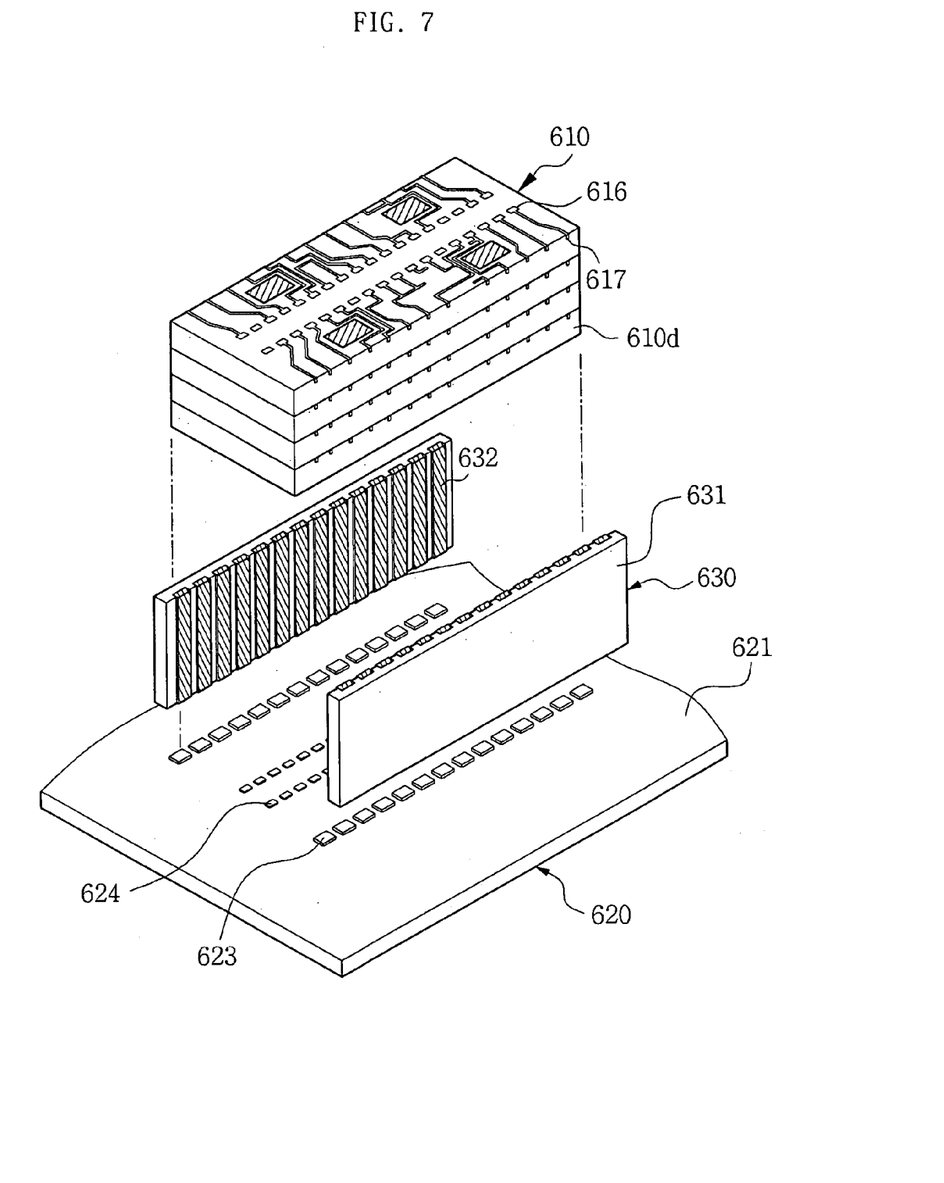
FIG. 7 is a partial perspective view showing a semi-processed chip stack package according to another embodiment of the present invention.

The above-mentioned interconnecting member 330, 430 of the chip stack package is described below with two preferred examples. As shown as FIG. 6, conductive adhesive 530 is used as one example of the interconnecting member. In this example, the conductive adhesive 530 is coated along each vertical row of ends, exposed to the side surface of the stack of chips, of the connection line 517, and terminated to the contact pads 523 on the top plane 521 of the circuit board 520. The thickness of and interval between the conductive adhesive 530 are controlled to prevent electrical contact failure and shorts. In another example, as shown in FIG. 7, the interconnecting member is a wiring board 630 having conductive lines 632 formed on an insulating board 631. In this example, the respective conductive lines 632 are attached to the connection lines 617 and to the first contact pads 623 of the circuit board 620. The lowest semiconductor chip is connected to the second contact pads 624 provided on the top plane 621 of the circuit board 620 by the above-described bumps (360, 460 in FIGS. 4 and 5 respectively).

The present chip stack package is effective in multifunctionality and high performance because one chip stack package can include providing different types of semiconductor chips as well as having the same types of semiconductor chips. Moreover, the present chip stack package can advantageously use center pad type semiconductor chips since the connection lines are provided between the bonding pads and the interconnecting member. Further, since the connection lines and the heat dissipation part are embedded in the chip, it is possible to reduce the entire thickness of the stack package without sacrificing the heat dissipation efficiency.

Figure 8A:
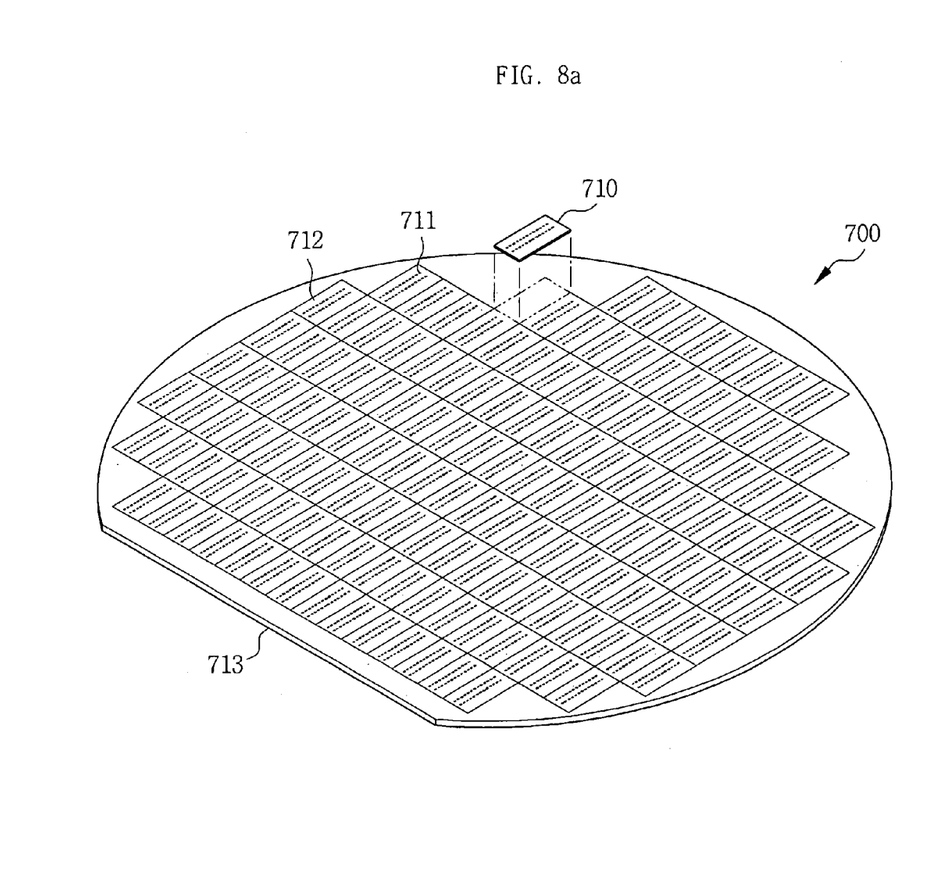
FIG. 8a to FIG. 8d are perspective views showing processes of a semiconductor chip of the present invention.

Manufacturing processes for the present chip stack package are described below. As shown in FIG. 8a, the multiplicity of semiconductor chips 710 are formed in a semiconductor wafer 700. The wafer 700 has the active surface 712 on which on-chip circuits and a plurality of bonding pads 711 are formed, and the back surface 713, obverse to the active surface 712. Preferably, the back surface 713 of the wafer 700 is ground to reduce the thickness of the resultant semiconductor chip 710.

Figure 8B:
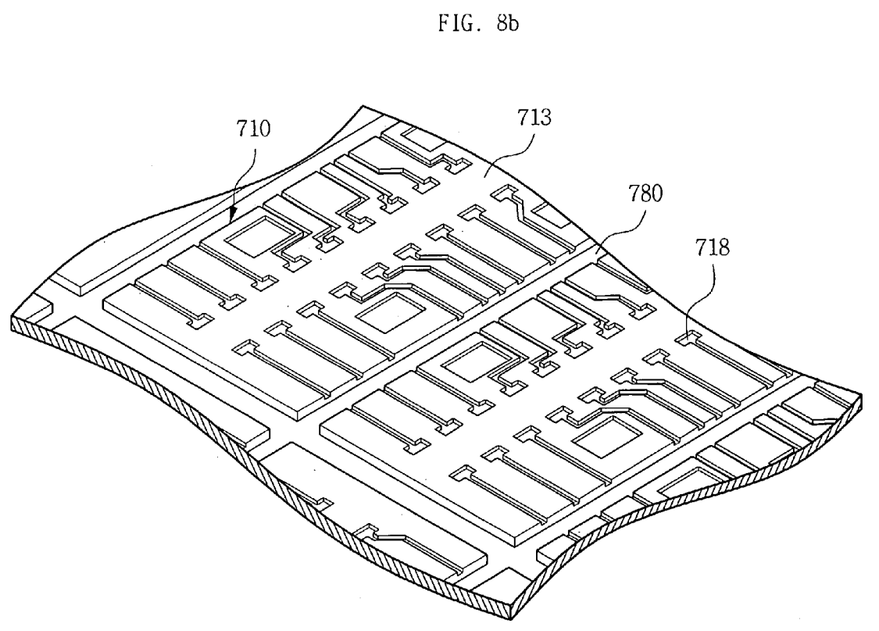

As shown in FIG. 8b, the grooves 718 are formed on the back surface 713 of the wafer 700. The grooves 718 can be made using the etching processes such as plasma etching or chemical etching. Additionally, an insulation layer (201a of FIG. 3a or 201b of FIG. 3b) can be formed on the entire back surface 713 or only on the grooves 718. The insulation layer is formed of silicon nitride or silicon oxide by the sputtering method, the chemical vapor deposition method or the thermal oxidation method, etc. A scribe line 780 is formed between the individual semiconductor chips 710. Preferably, the depth of the scribe line 780 is greater than that of the grooves 718. And, the width of the scribe line 780 is almost equal to that of a cutting tool used when scribing the wafer 700.

Figure 8C:
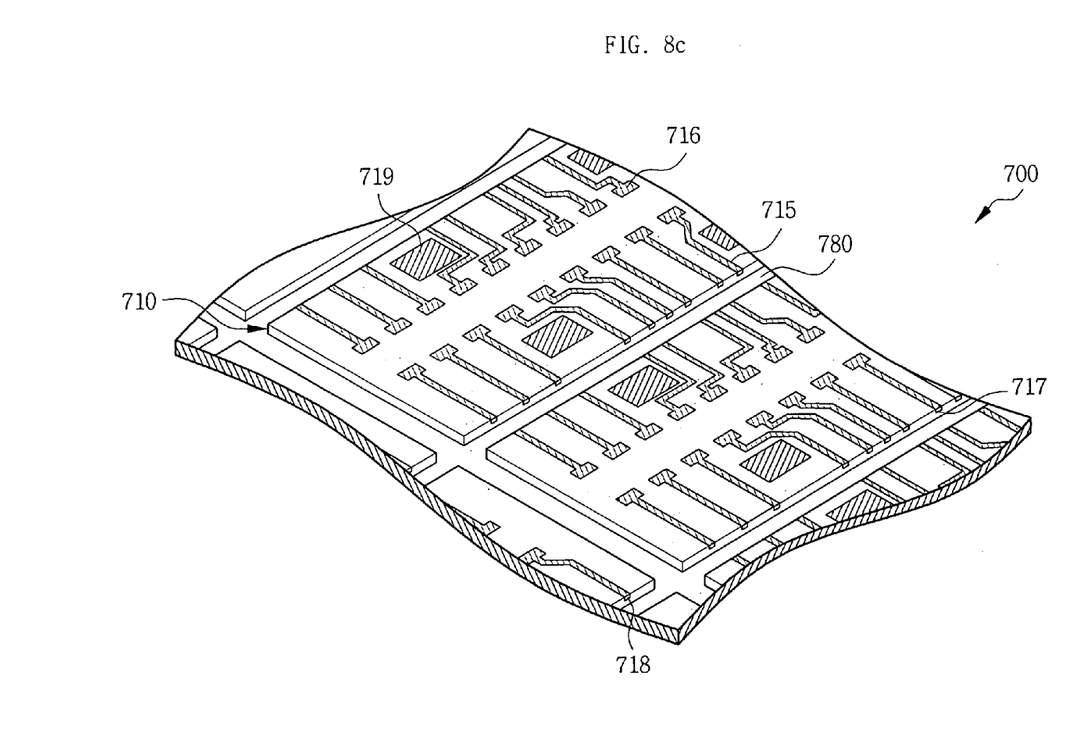

As shown in FIG. 8c, conductive material is filled in the grooves 717 to form the bump pads 716, the connection lines 717 and the heat dissipation parts 719 by the sputtering method, the plating method or the chemical vapor deposition method, etc. The connection lines 717 are extended to the side surface 715 of the chip 710 and exposed to the scribe 780.

Figure 8D:
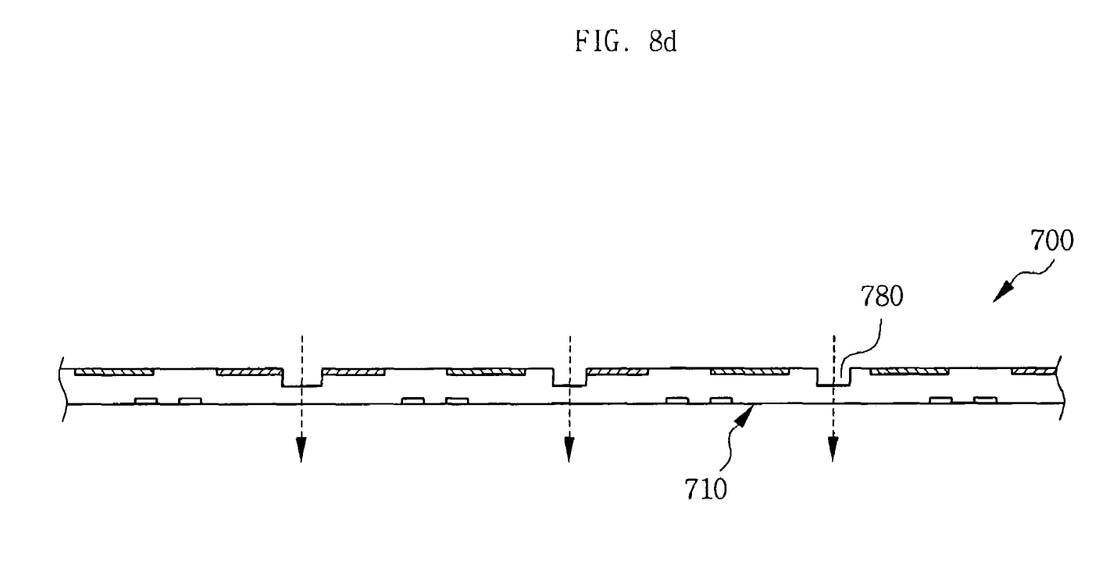

As shown in FIG. 8d, wafer 700 is scribed into the plurality of semiconductor chips 710. The cutting tool 790 such as a blade or the laser separates the wafer 700 following the scribe line 780 into the individual semiconductor chips 710.

The manufacturing method for the chip stack package using this semiconductor chip is described below, for example, with reference to FIG. 4. Two semiconductor chips, for example, 304 and 305 are stacked and bonded to each other. The bonding of two chips 304 and 305 is made by the bump 360 interposed therebetween. The bump 360 is formed on the bonding pad 311 of the upper semiconductor chip 305 and/or the bump pad 316 of the lower semiconductor chip 304. On the other hand, the bonding pads 311 of the lowest chip 301 are connected to the circuit board 320 by the bump 360.

The interconnecting member 330 is connected to the connection line of the chip 310 and to the contact pad of the board 320. When the conductive adhesive 530 of FIG. 6 is used as the interconnecting member, the conductive adhesive is applied on the side surface of the chip stack along the respective rows of the connection lines 517, and to the contact pads 523 on the top plane 521 of the board 520. When the wiring board 630b of FIG. 7 is alternatively used, the conductive pattern 632 of the wiring board 630 is connected to the connection lines 617 of the chip stack and to the second contact pads 623 of the board 620 by metallic bumps or conductive adhesive.

The outer terminals are connected to the circuit board. For example, as shown in FIG. 4, in case of using the metallic balls 340a such as solder balls as the outer terminals, the balls 340 are attached on the bottom plane 322 of the board 320 using reflow processes. In another embodiment, as shown in FIG. 5, the lead frame 440 is used as the outer terminals, and the bonding wires 470 connect the lead frame 440 and the board 420. The wire-bonded portions are then encapsulated by, for example, resin encapsulant 450.

Although the present invention has been described in detail herein above with respect to the preferred embodiments thereof, many variations and/or modifications thereof will be apparent to those of ordinary skill in the art. Therefore, all such variations and modifications are seen to fall within the true spirit and scope of the present invention as defined by the appended claims.

What is claimed is:

1. A method of manufacturing a semiconductor chip, comprising:
   (a) providing a semiconductor wafer having a plurality of semiconductor chips and scribe lines, each semiconductor chip having bonding pads formed on an active surface, and each scribe line being formed between the adjacent semiconductor chips;
   (b) forming a plurality of grooves on a back surface obverse to the active surface;
   (c) forming a plurality of bump pads and connection lines by applying a conductive material in the grooves, each bump pad corresponding to each bonding pad, and each connection line being extended from the bump pad and exposed to the scribe line; and
   (d) separating the wafer along the scribe lines into the plurality of semiconductor chips.

2. The method of claim 1, wherein forming the grooves includes forming an insulation layer in the grooves.

3. The method of claim 1, wherein forming the grooves includes forming an insulation layer on the entire back surface of the semiconductor wafer.

4. The method of claim 1, wherein the bump pads and connection lines are formed by a sputtering method.

5. The method of claim 1, wherein the bump pads and connection lines are formed by a plating method.

6. The method of claim 1, wherein the bump pads and connection lines are formed by a chemical vapor deposition method.

7. The method of claim 1, wherein the grooves include grooves for heat dissipation parts.

8. The method of claim 1, wherein forming the bump pads and connection lines includes forming heat dissipation parts.

9. The method of claim 1, wherein providing the semiconductor wafer includes grinding the back surface of the semiconductor wafer.

10. A method of manufacturing a chip stack package, comprising:
    (a) providing a lower semiconductor chip and at least one upper semiconductor chip, each semiconductor chip having bonding pads formed on an active surface, bump pads formed on a back surface obverse to the active surface and respectively corresponding to the bonding pads, and connection lines formed on the back surface and respectively extended from the bump pads to a side surface between the active surface and the back surface;
    (b) providing a circuit board having first contact pads and second contact pads;
    (c) bonding, by using bumps, the bonding pads of the upper semiconductor chip to the bump pads of the lower semiconductor chip, and the bonding pads of the lower semiconductor chip to the second contact pads of the circuit board;
    (d) applying an interconnecting member to the side surfaces of both the lower semiconductor chip and the upper semiconductor chip such that the interconnecting member is electrically connected to the connection lines at the side surfaces and the first contact pads of the circuit board; and
    (e) forming outer terminals such that the outer terminals are electrically connected to the circuit board.

11. The method of claim 10, wherein the outer terminals are metallic balls.

* * * * *